United States Patent
Eldridge et al.

(10) Patent No.: US 6,709,968 B1
(45) Date of Patent: Mar. 23, 2004

(54) MICROELECTRONIC DEVICE WITH PACKAGE WITH CONDUCTIVE ELEMENTS AND ASSOCIATED METHOD OF MANUFACTURE

(75) Inventors: Jerome M. Eldridge, Los Gatos, CA (US); Paul A. Farrar, South Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/640,149

(22) Filed: Aug. 16, 2000

(51) Int. Cl.[7] .......................................... H01L 21/4763
(52) U.S. Cl. ................ 438/619; 438/778; 438/788; 438/790; 438/791; 438/840; 438/841; 438/842; 438/843
(58) Field of Search ................... 438/619, 778, 438/788, 790, 791; 29/840, 842, 843, 841

(56) References Cited

U.S. PATENT DOCUMENTS

| | | |
|---|---|---|
| 2,244,608 A | 6/1941 | Cooper |
| 3,147,110 A | 9/1964 | Foerster |
| 3,337,334 A | 8/1967 | Fenn et al. |
| 3,506,438 A | 4/1970 | Krock et al. |
| 3,548,915 A | 12/1970 | Richmond et al. |
| 3,548,948 A | 12/1970 | Richmond et al. |
| 3,687,737 A | 8/1972 | Krock et al. |
| 4,389,429 A | 6/1983 | Soclof |
| 4,561,173 A | 12/1985 | Te Velde |
| 4,962,058 A | 10/1990 | Cronin et al. |
| 5,158,986 A | 10/1992 | Cha et al. |
| 5,173,442 A | 12/1992 | Carey |
| 5,324,683 A | 6/1994 | Fitch et al. |
| 5,324,684 A | 6/1994 | Kermani et al. |
| 5,334,356 A | 8/1994 | Baldwin et al. |
| 5,336,914 A | 8/1994 | Andoh |

(List continued on next page.)

FOREIGN PATENT DOCUMENTS

| | | |
|---|---|---|
| EP | 0 578 856 A1 | 1/1994 |
| GB | 2 158 995 A | 11/1985 |

OTHER PUBLICATIONS

Vardaman, E. Jan; Future Packaging Trends: CSP vs. Flip Chip; Proceeding of the 11th European Microelectronic Conference; 1997, p. 295–299.
U.S. patent application Ser. No. 09/384,157, Forbes et al., filed May 31, 2000.
U.S. patent application Ser. No. 09/382,929, Farrar, filed Apr. 25, 1999.

(List continued on next page.)

Primary Examiner—David Nelms
Assistant Examiner—Reneé R. Berry
(74) Attorney, Agent, or Firm—Perkins Coie LLP

(57) ABSTRACT

A microelectronic device package and method for manufacture. In one embodiment, the device package can include a microelectronic substrate having first and second device features, a conductive link that includes a conductive material extending between the first and second device features, and an external cover attached to the substrate and at least partially enclosing the first and second device features and the conductive link. The external cover can have a composition substantially identical to the composition of the conductive links and the external cover can be formed simultaneously with formation of the conductive link to reduce the number of process steps required to form the microelectronic device package. A sacrificial material can temporarily support the conductive link during manufacture and can subsequently be removed to suspend at least a portion of the conductive link between two points.

38 Claims, 6 Drawing Sheets

U.S. PATENT DOCUMENTS

| | | | |
|---|---|---|---|
| 5,408,742 A | | 4/1995 | Zaidel et al. |
| 5,444,105 A | | 8/1995 | Ornstein |
| 5,447,264 A | * | 9/1995 | Koopman et al. ............ 28/563 |
| 5,457,334 A | | 10/1995 | Nishimoto |
| 5,470,802 A | | 11/1995 | Gnade et al. |
| 5,473,814 A | | 12/1995 | White |
| 5,510,645 A | | 4/1996 | Fitch et al. |
| 5,578,146 A | | 11/1996 | Grant et al. |
| 5,593,926 A | | 1/1997 | Fujihira |
| 5,725,689 A | | 3/1998 | Nishida et al. |
| 5,747,880 A | | 5/1998 | Havemann et al. |
| 5,786,630 A | | 7/1998 | Bhansali et al. |
| 5,798,559 A | | 8/1998 | Bothra et al. |
| 5,821,621 A | | 10/1998 | Jeng |
| 5,844,317 A | | 12/1998 | Bertolet et al. |
| 5,866,953 A | | 2/1999 | Akram et al. |
| 5,879,787 A | | 3/1999 | Petefish |
| 5,891,797 A | | 4/1999 | Farrar |
| 5,900,668 A | | 5/1999 | Wollesen |
| 5,972,737 A | * | 10/1999 | Polese et al. ............ 438/122 |
| 5,983,492 A | * | 11/1999 | Fjelstad ............ 29/843 |
| 5,989,941 A | | 11/1999 | Wensel |
| 6,046,496 A | | 4/2000 | Corisis et al. |
| 6,048,744 A | | 4/2000 | Corisis et al. |
| 6,049,125 A | | 4/2000 | Brooks et al. |
| 6,075,288 A | | 6/2000 | Akram |
| 6,077,792 A | | 6/2000 | Farrar |
| 6,078,088 A | | 6/2000 | Buynoski |
| 6,122,171 A | | 9/2000 | Akram et al. |
| 6,148,509 A | | 11/2000 | Schoenfeld et al. |
| 6,153,924 A | | 11/2000 | Kinsman |
| 6,159,764 A | | 12/2000 | Kinsman et al. |
| 6,163,956 A | | 12/2000 | Corisis |
| 6,204,091 B1 | * | 3/2001 | Smith et al. ............ 438/108 |
| 6,208,519 B1 | | 3/2001 | Jiang et al. |
| 6,211,561 B1 | | 4/2001 | Zhao |
| 6,215,175 B1 | | 4/2001 | Kinsman |
| 6,229,100 B1 | * | 5/2001 | Fjelstad ............ 174/261 |
| 6,252,772 B1 | | 6/2001 | Allen |
| 6,268,262 B1 | | 7/2001 | Loboda |
| 6,303,981 B1 | | 10/2001 | Moden |
| 6,314,639 B1 | | 11/2001 | Corisis |
| 6,324,754 B1 | | 12/2001 | DiStefano et al. |
| 6,326,242 B1 | | 12/2001 | Brooks et al. |
| 6,326,687 B1 | | 12/2001 | Corisis |
| 6,344,976 B1 | | 2/2002 | Schoenfeld et al. |
| 6,384,473 B1 | | 5/2002 | Peterson et al. |
| 6,429,522 B2 | | 8/2002 | Petrarca et al. |
| 6,495,445 B2 | | 12/2002 | Clevenger et al. |

OTHER PUBLICATIONS

U.S. patent application Ser. No. 09/894,528, Eldridge et al., filed Jun. 27, 2001.

U.S. patent application Ser. No. 09/927,302, Eldridge et al., filed Aug. 10, 2001.

Volksen, W., et al., "Characterization and Processing Considersations for Methylsilsesquioxane Based Dielectrics", *Proceedings of the Fifth Dielectric for ULSI Multilevel Interconnections,* Santa Clara, CA, pp. 83–90, (1999).

Shibasaki, T., et al., "Process and Application of Fumed Silica AEROSIL", $3^{rd}$ Annulal Workshop on Mechanical Polishing, Lake Placid New York, pp. 1–26, (1998).

Chiniwalla, P., et al., "Structure–Property Relations for Polynorbornenes", *Proceedings from the Eighth Meeting of the Dupont Symposium on Polymides in Microelectronics,* pp. 615–642, (1998).

Jin, C., et al., "Porous Xerogel Films as Ultra–Low Permittivity Dielectric for ULSI Interconnect Applications", *Conference Proceedings ULSI XII–1997 Materials Research Society,* 463–469, (1997).

Ramos, T., et al., "Nanoporous Silica for Dielectric Constant Less Than 2", *Conference Proceedings ULSI XII–1997 Materials Research Society,* pp. 455–461, (1997).

Jayaraj, K., et al., "Low–Dielectric Constant Microcelluar and Foams", *Proceedings from the Seventh Meeting of the Dupont Symposium on Polymides in Microelectronics,* pp. 474–501, (Sep. 1996).

Miller, R. D., et al., "Low Dielectric Constant Polyimides and Polyimide Nanofoams", *Proceedings from the Seventh Meeting of the Dupont Symposium on Polymides in Microelectronics,* pp. 443–473, (Sep. 1996).

Ting, C. H., "Low K Material/Process Development", *1996 VLSI Multilevel Interconnection State–of–the–Art Seminar,* pp. 171–212, (Jun. 1996).

"Packaging", *Electronic Materials Handbook, vol. 1,* ASM International, pp. 105, 768–769, (1989).

"Properties and Selection: Nonferous Alloys and Pure Metals", *Metals Handbook Ninth Edition, vol. 2,* ASM International, pp. 157, 395, (1979).

Van Vlack, L. H., *Elements of Materials Science,* Addison–Wesley Publishing Co., Inc. Reading, MA, p. 468, (1959).

* cited by examiner

MICROELECTRONIC DEVICE WITH PACKAGE WITH CONDUCTIVE ELEMENTS AND ASSOCIATED METHOD OF MANUFACTURE

TECHNICAL FIELD

This invention relates to microelectronic device packages having heat and/or current conducting structures, and methods for manufacturing and processing such packages.

BACKGROUND OF THE INVENTION

Packaged microelectronic assemblies, such as memory chips and microprocessor chips, typically include a microelectronic substrate die encased in a plastic, ceramic, or metal protective covering. The die includes functional devices or features, such as memory cells, processor circuits, and interconnecting wiring. The die also typically includes bond pads electrically coupled to the functional devices. The bond pads can be coupled to pins or other types of terminals that extend outside the protective covering for connecting to busses, circuits and/or other microelectronic assemblies.

As the size of microelectronic device packages decreases to allow the packages to fit into more compact electronic products (such as mobile phones and laptop computers), the distances between adjacent functional devices and between adjacent interconnecting wires decreases. As these distances decrease, the likelihood for capacitive coupling between adjacent structures increases, which can impair or reduce the maximum performance of the packaged microelectronic device.

One approach to decreasing the capacitance between neighboring wires within the die is to reduce the dielectric constant of the solid material between the wires. For example, polyimides, (having a dielectric constant of 3.5) have been used to replace silicon dioxide (having a dielectric constant of 4). A more substantial reduction in the dielectric constant is obtained by replacing the solid insulating material typically positioned between layers of the wiring with a gas, such as air. For example, U.S. Pat. No. 5,891,797 to Farrar and U.S. Pat. No. 5,324,683 to Fitch et al. disclose a process for building successive layers of wiring on a semiconductor substrate by temporarily supporting the wires with sacrificial filler material, and then removing the filler material from around the wires by etching or a plasma process to form suspended "air bridges" that conduct electrical signals from one part of the device package to another. The wires can be formed in the filler material using a dual damascene process, such as is disclosed in U.S. Pat. No. 4,962,058 to Cronin et al. The support material can include a resist material, as disclosed in U.S. Pat. No. 5,593,926 to Fujihiri, that can be removed by etching processes (such as the processes disclosed in U.S. Pat. No. 4,561,173 to Te Velde) or evaporative processes (such as the processes disclosed in U.S. Pat. No. 5,408,742 to Zaidel et al.). U.S. Pat. Nos. 5,891,797; 5,324,683; 4,962,058; 5,593,926; 4,561,173; and 5,408,742 are herein incorporated in their entirety by reference.

It can be shown that the maximum unsupported link of an air bridge in an integrated circuit is governed by the following equation:

$$L = \sqrt[4]{32E\delta h^2/5p} \text{ or } \approx 1.6 \, (E\delta/p)^{1/4} h^{1/2}$$

where
- L = the unsupported bridge length
- E = the modular elasticity of the bridge material
- $\delta$ = the maximum allowable deflection of the bridge
- p = the density of the bridge material
- h = the vertical thickness of the bridge As microelectronic devices become smaller, the thicknesses of the bridges and the distances between adjacent bridges, also become smaller. To prevent the bridges from sagging into each other, the maximum unsupported length of each bridge decreases. For example, if the bridge is made of an aluminum copper silicon alloy (which has a module of elasticity of 71 GPa and a density of 2.79 $Mg/m^3$), has a maximum allowable deflection of 5,000 angstroms (including a safety factor), and a thickness of 10,000 angstroms, the maximum unsupported bridge length is approximately 1.6 millimeters. If the maximum allowable deflection is decreased to 2,500 angstroms, and the bridge thickness is reduced to 5,000 angstroms, the maximum unsupported bridge length is approximately 1 millimeter. If the maximum allowable deflection is further decreased to 1,500 angstroms, the maximum allowable unsupported length is approximately 0.6 millimeters. Because current chips typically measure over 1 centimeter along an edge, it becomes increasingly difficult to reduce the thickness of the bridges and the spacing between bridges without supporting the bridges at such frequent intervals that the benefits of unsupported bridge segments (e.g., the reduced dielectric constant of the material adjacent to the bridge) are lost.

Furthermore, as the bridge thickness (and therefore the cross-section of the conductive line forming the bridge) decreases, the resistivity of the wire forming the bridge increases. One approach to addressing this drawback is to reduce the bulk resistivity of the wire, for example, by replacing aluminum alloy wires with copper wires. However, copper has a significantly greater density than aluminum and aluminum alloys, and therefore has only 85% of the unsupported bridge length of an aluminum or aluminum alloy conductor.

Another problem with conventional air bridge designs is that the air adjacent to the wires typically has a lower thermal conductivity than the solid material it replaced. Accordingly, it can be more difficult to transfer heat from the packaged microelectronic device. As a result, the microelectronic device may be more likely to overheat, which can reduce the life expectancy and/or performance level of the device.

Still another problem with conventional air bridge designs is that several process steps are typically required to first form each layer of wiring in the microelectronic device, and then several additional process steps are required to package the device. Accordingly, the overall process of wiring and packaging the device can be expensive and susceptible to process variables and errors.

SUMMARY

The present invention is directed toward microelectronic device packages and methods for forming such packages. A method in accordance with one aspect of the invention includes forming microelectronic device features at least proximate to a surface of a microelectronic substrate, simultaneously forming an external wall portion of the package and a conductive link coupled to at least one of the microelectronic device features, and removing a sacrificial material adjacent to the conductive link to suspend at least a portion of the conductive link between two points. The sacrificial material can include first components and second components arranged in layers to include etch stop layers of the second component disposed between layers of the first component. The method can further include selecting a material for the external wall portion to be the same as the material for the conductive link.

In one aspect of the invention, the package can be inverted before the sacrificial material is removed and solder balls can be coupled to a portion of the conductive link while the microelectronic substrate is in an inverted position. In still another aspect of the invention, the method can include forming a self-supporting internal heat transfer structure within the internal wall of the package, with at least a portion of the heat transfer structure being spaced apart from the microelectronic substrate and the external wall.

The invention is also directed toward a microelectronic device package. In one embodiment, the package can include a microelectronic substrate having first and second microelectronic device features, a conductive link that includes a conductive material extending between the first and second microelectronic device features, and an external cover attached to the substrate and at least partially enclosing the first and second microelectronic device features and the conductive link. In a further aspect of the invention, the external cover can have a composition substantially identical to a composition of the conductive link. The package can further include a removable sacrificial support material positioned between the conductive link and the microelectronic substrate. The sacrificial material can include a carbonaceous material or a polymer, and the conductive material can include copper or aluminum.

DETAILED DESCRIPTION

The present disclosure describes packaged microelectronic devices and methods for manufacturing such devices. Many specific details of certain embodiments of the invention are set forth in the following description and in FIGS. 1A–6 to provide a thorough understanding of these embodiments. One skilled in the art, however, will understand that the present invention may have additional embodiments, and the invention may be practiced without several of the details described below.

Figure 1A:
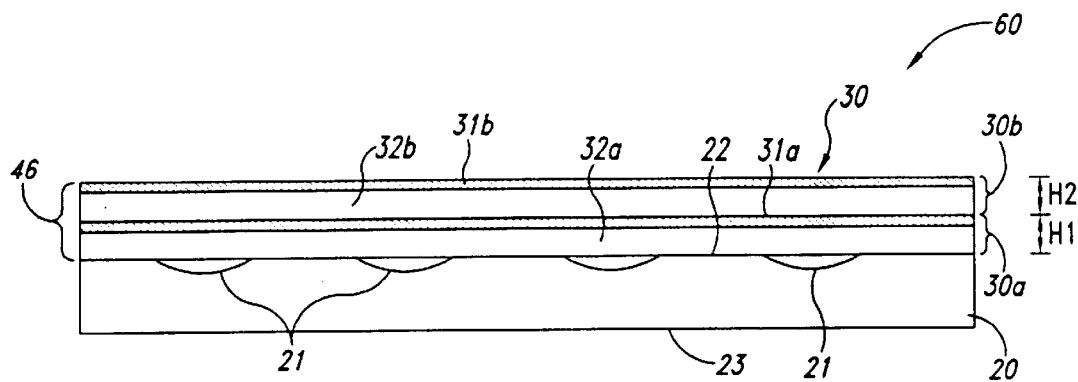
FIGS. 1A–1G are partially schematic, cross-sectional side elevational views depicting a process for forming a packaged microelectronic device having a first level of conductive structures in accordance with an embodiment of the invention.
Figure 1B:
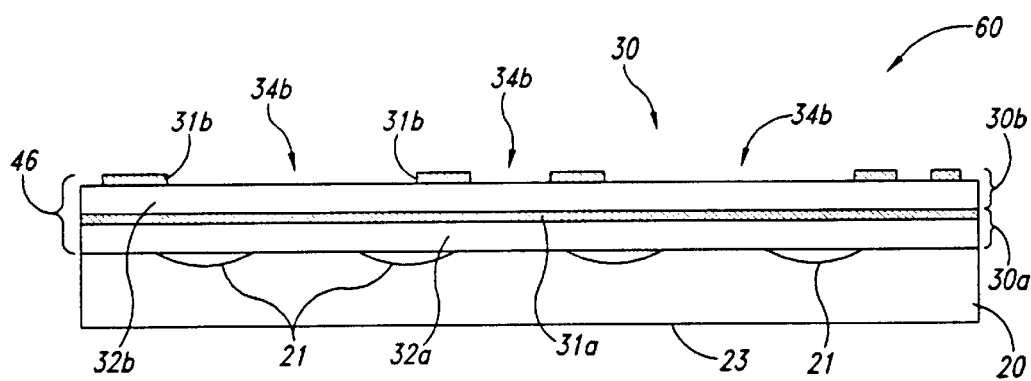

FIGS. 1A–1G illustrate a method for forming a portion of a microelectronic device package 60 in accordance with embodiment of the invention. Referring first to FIG. 1A, the package 60 can include a microelectronic substrate 20, such as a silicon substrate, having an upper surface 22 and a lower surface 23 opposite the upper surface 22. A plurality of device features 21 (such as memory cells, transistors, and/or processor components, shown schematically in FIG. 1A) are formed at the upper surface 22. Additional device features (not shown) may also be formed beneath the upper surface 22. The device features 21 can be connected to each other and to external terminals of the package 60 with suspended or partially suspended conductive links (described in greater detail below with reference to FIG. 1G). In one embodiment, the conductive links are grouped in discrete levels or strata, with a first level 46 positioned on the upper surface 22 of the substrate 20, and subsequent levels stacked on the first level 46.

In one aspect of this embodiment, the first level 46 is initially filled with a sacrificial support structure or mandrel 30. The sacrificial, support structure 30 can include a lower level portion 30a disposed on the substrate upper surface 22 and an upper level portion 30b disposed on the lower level portion 30a. Each level portion 30a, 30b can include a bulk support material 32 (shown as a lower support layer 32a and an upper support layer 32b) and an etch stop material 31 (shown as a lower etch stop layer 31a and an upper etch stop layer 31b). The etch stop material 31 can include an oxide (such as silicon dioxide), a nitride (such as silicon nitride) or other selectively removable materials. The bulk support material 32 can include carbon or a polymer (such as a photoresist material, a polyimide, parylene or parylene-C) so long as the bulk support material 32 is rigid enough to support the conductive links, but can also be easily removed from adjacent to the conductive links without damaging the conductive links, as described in greater detail below.

In another aspect of this embodiment, the lower support layer 32a and the lower etch stop layer 31a have a combined height or thickness H1 that corresponds to the height of the gap beneath the suspended portions of the conductive links in the first level 46. The upper support layer 32b and upper etch stop layer 31b have a combined height or thickness H2 that corresponds to the thickness of the suspended portions of the conductive links in the first level 46.

Figure 1C:
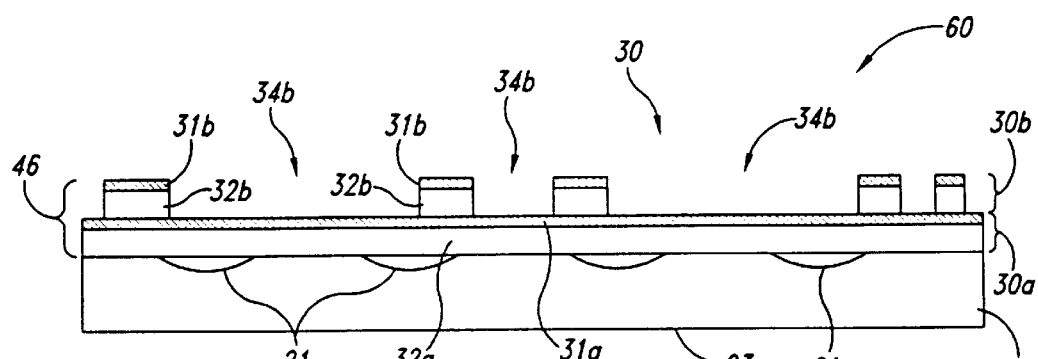
Figure 1D:
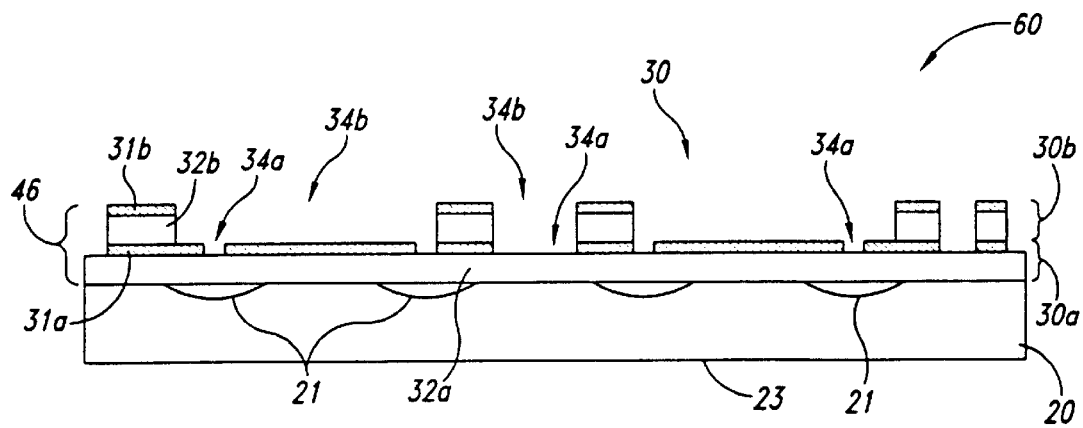
Figure 1E:
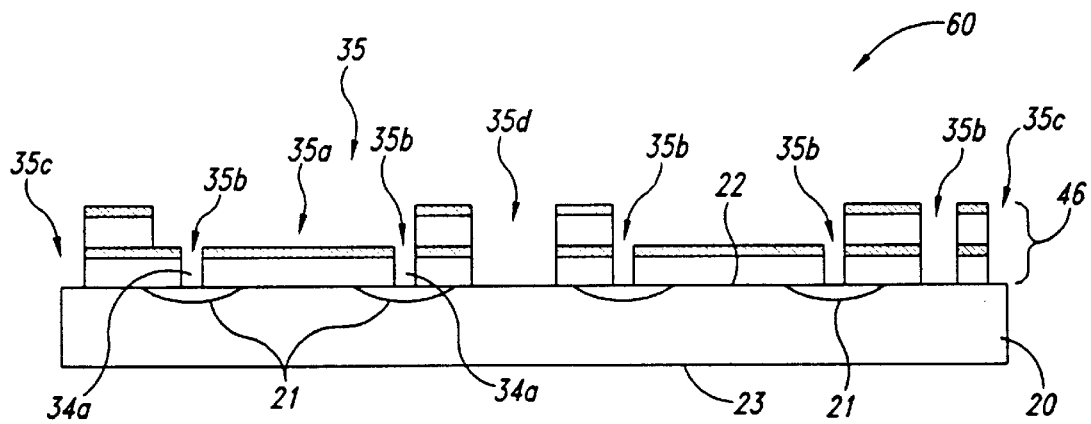

In one embodiment the conductive links and other conductive components are formed in the first level 46 using a dual damascene process. For example (referring now to FIG. 1B), upper level apertures 34b are etched into the upper etch stop layer 31b using a conventional mask and photoresist process. In FIG. 1C, the upper support layer 32b is etched to extend the upper level apertures 34b down to the lower etch stop layer 31a. As shown in FIG. 1D, a second mask and photoresist process is used to form lower level apertures 34a in the lower etch stop layer 31a. As shown in FIG. 1E, the lower level apertures 34a are extended down to the upper surface 22 of the substrate 20 by etching through the lower support layer 32a. The lower level apertures 34a and the upper level apertures 34b together define a plurality of cavities 35 extending entirely through the sacrificial support material 30. The cavities 35 include laterally extending cavities 35a that are generally parallel to the upper surface 22 of the substrate 20 and define the suspended portion of the conductive links. The cavities 35 also include vertical cavities 35b (defining vias of the conductive links) that couple the lateral cavities 35a to the device features 21.

Additional vertical cavities 35c and 35d define conductive external wall portions and conductive internal support structures, respectively, of the package 60.

Figure 1F:
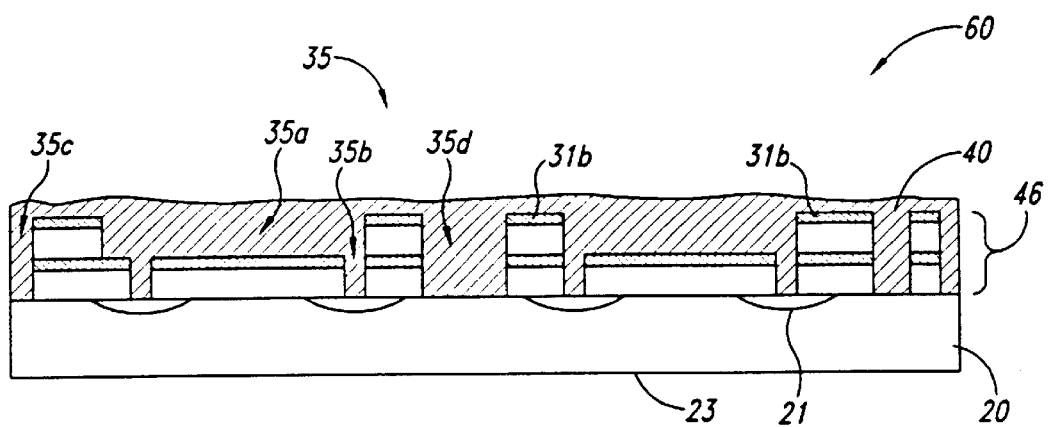
Figure 1G:
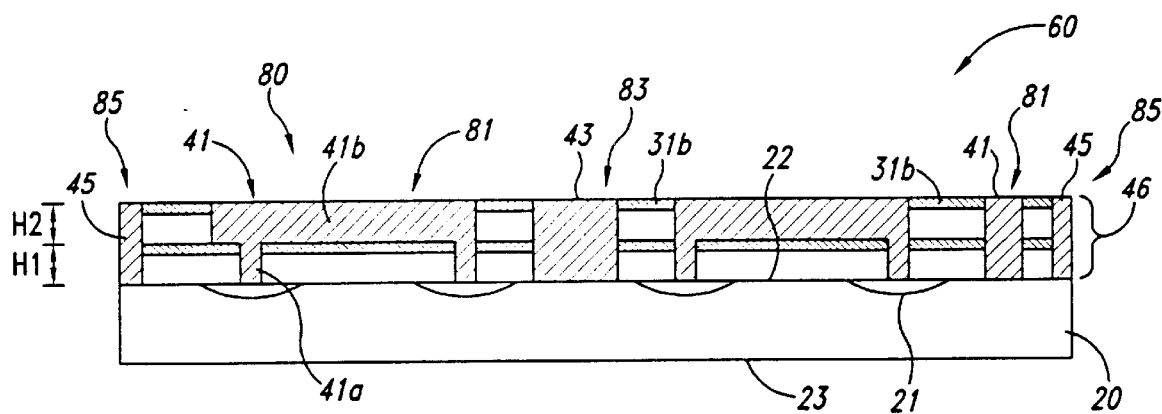

Referring now to FIG. 1F, a conductive material 40 is disposed on the device package 60 to fill in the gaps 35. The conductive material 40 can include copper, aluminum, gold, and/or silver, or the conductive material can include other conductive elements and/or compounds of these elements. In FIG. 1G, the conductive material 40 is planarized (for example, by chemical-mechanical planarization) or otherwise processed to remove excess conductive material 40 down to the level of the upper etch stop layer 31b. Accordingly, the conductive material 40 forms a plurality of electrically and thermally conductive structures 80. Each conductive structure 80 can include a first level portion in the first level 46 connected to corresponding portions in other levels (described below with reference to FIGS. 2–5). For example, the conductive structures 80 can include electrically conductive links 81 having first level portions 41 in the first level 46. The first level portions 41 can include via portions 41a extending transverse to the substrate upper surface 22, and bridge portions 41b extending generally parallel to the substrate upper surface 22.

The conductive structures 80 can further include an internal conductive support 83 with a first level portion 43 that extends transversely to the upper surface 22 within the package 60. The internal conductive support 83 can include a rib that extends a substantial distance transverse to the plane of FIG. 1G, or a post that extends a limited distance transverse to the plane of FIG. 1G. An external wall or cover 85 includes a first level portion 45 that extends transversely to the substrate upper surface 22 along the outer periphery of the substrate 20 to encapsulate both the substrate 20 and the other conductive structures.

Both the internal conductive support 83 and the external wall 85 can support other structures in levels above the first level 46. Alternatively, (for example, when the package 60 is a "flip chip"), the internal conductive supports 83 and the external wall 85 can be sized to support the substrate 20 when the package 60 is inverted. When several packages 60 are initially formed on the same substrate 20, the external walls 85 can also be sized to account for the width of a blade or other cutting medium that singulates adjacent completed packages 60 from each other.

Figure 2:
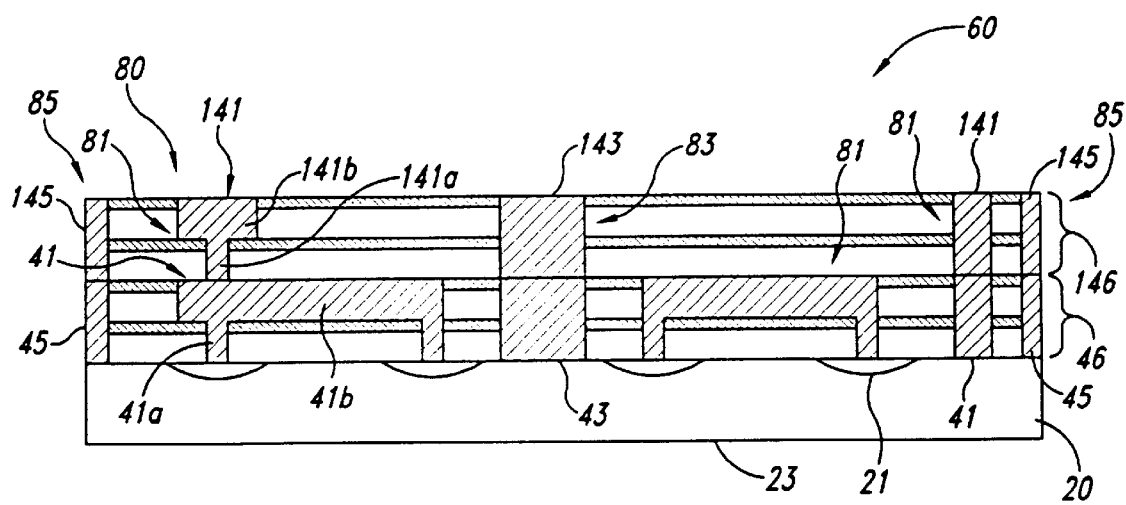
FIG. 2 is a partially schematic, cross-sectional side elevational view of the device shown in FIG. 1G having a second level of conductive structures in accordance with an embodiment of the invention.

FIG. 2 is a partially schematic, side elevational view of the package 60 shown in FIG. 1G having a second level 146 of conductive structures in accordance with an embodiment of the invention. The conductive structures in the second level 146 can be formed on top of the conductive structures in the first level 46 using process steps generally similar to those described above with reference to FIGS. 1A–1G. The conductive structures in the second level 146 can include second level portions 141 of the conductive links 81 described above with reference to FIG. 1G. The second level portions 141 can include horizontal bridge portions 141b and vertical via portions 141a connected to the first level portions 41 in the first level 46 below. Similarly, second level portions 143 of the internal conductive support 83 are connected to the first level portions 43 below, and second level portions 145 of the external wall 85 are connected to the first level portions 45 in the first level 46.

In one aspect of an embodiment shown in FIG. 2, the bridge portions 141b of the conductive links 81 in the second level 146 extend transverse to the plane of FIG. 2, and the bridge portions 41b of the conductive links 81 in the first level 46 extend parallel to the plane of FIG. 2. Accordingly, the orientation of the conductive links 81 can alternate with each successive level to reduce the likelihood for physical interference between conductive links 81 in the same level.

Figure 3:
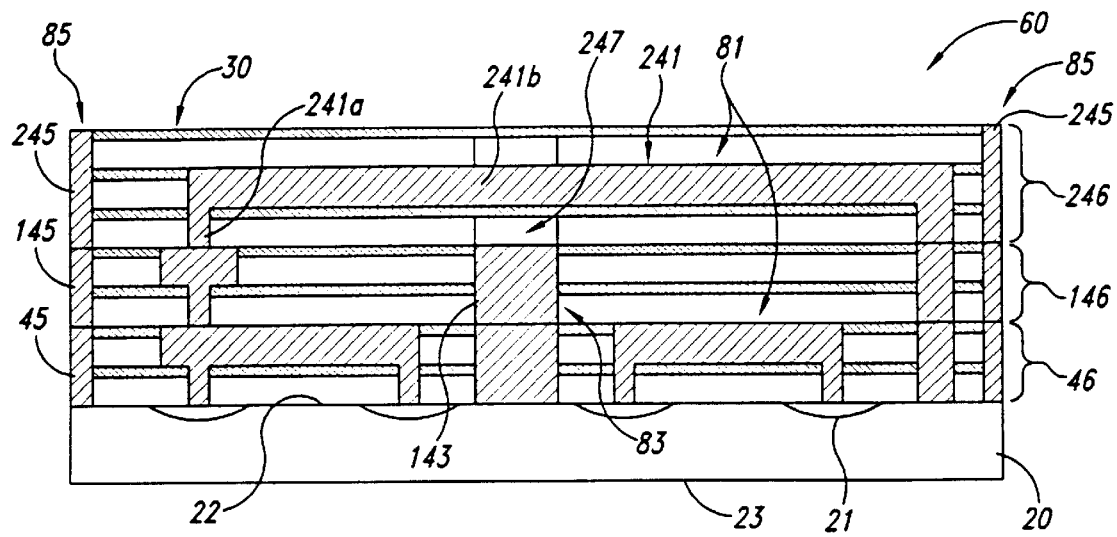
FIG. 3 is a partially schematic, cross-sectional side elevational view of the microelectronic device shown in FIG. 2 having a third level of conductive structures in accordance with an embodiment of the invention.

FIG. 3 is a partially schematic, side elevational view of the package 60 described above with reference to FIGS. 1A–2 having a third level 246 of conductive structures disposed on the second level 146. The third level 246 can be formed using processes generally similar to those described above with reference to FIGS. 1A–1G to form third level portions 241 and 245 of the conductive links 81 and the external wall 85, respectively. The third level portion 241 of the conductive link can include a via portion 241a extending generally transverse to the upper surface 22 of the substrate 20 and a bridge portion 241b extending generally parallel to the upper surface 22.

In one aspect of this embodiment, the third level portion 241 of one or more of the conductive links 81 can extend through the internal support 83. Accordingly, the internal support 83 can have an aperture 247 through which the bridge portion 241b of the conductive link 81 passes, with the bridge portion 241b separated from the walls of the aperture 247. The walls of the aperture 247 are defined in part by the upper surface of the second level portion 143 of the internal conductive support 83 and the lower surface of the third level portion, described below with reference to FIG. 4. The bridge portion 241b can be separated from the walls of the aperture 247 by a gas or a solid insulating material. For example, when the bridge portion 241b is separated from the aperture walls by a gas, the sacrificial support material 30 in the third level 246 can be formed with materials and processes similar to those of the first level 46 and second level 146, so that the sacrificial support material 30 from all three levels can be removed by the same process (described below with reference to FIG. 5). Furthermore, the aperture 247 and the bridge portion 241b can be sized and arranged to prevent the bridge portion 241b from sagging into the walls of the aperture 247. Alternatively, the bridge portion 241b can be supported in the aperture 247 by a non-sacrificial material that remains in place to support the bridge portion 241b after the sacrificial support material 30 has been removed.

Figure 4:
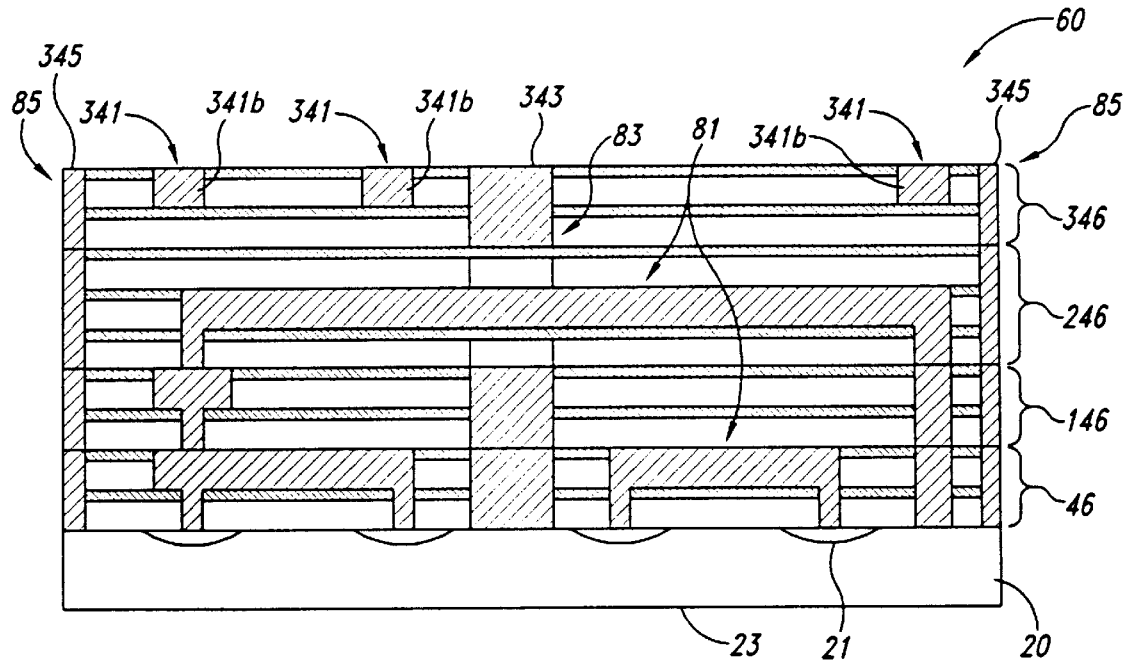
FIG. 4 is a partially schematic, cross-sectional side elevational view of the microelectronic device shown in FIG. 3 having a fourth level of conductive structures in accordance with an embodiment of the invention.

FIG. 4 is a partially schematic, side elevational view of the package 60 described above with reference to FIGS. 1A–3 having a fourth level 346 of conductive structures disposed on the third level 246. The fourth level 346 can include conductive link portions 341 having bridge portions 341b coupled with vias (not visible in FIG. 4) to other portions of the conductive links 81 or to other structures beneath the fourth level 346. The fourth level 346 can also include fourth level portions 343 and 345 of the internal support 83 and the external wall 85, respectively.

Figure 5:
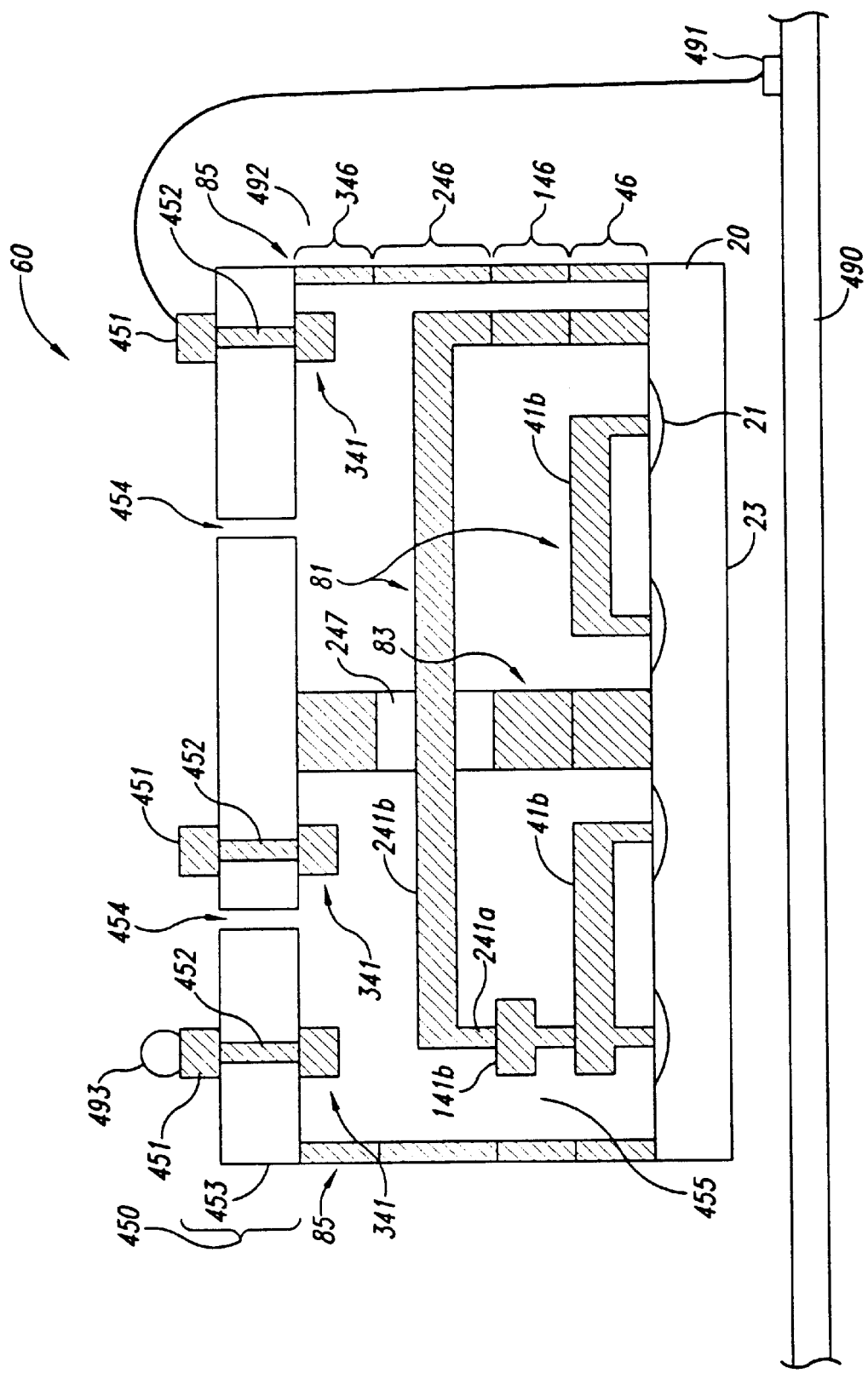
FIG. 5 is a partially schematic, cross-sectional side elevational view of the microelectronic device shown in FIG. 4 having bond pads in accordance with an embodiment of the invention.

FIG. 5 is a partial schematic, side elevational view of the package 60 having a connection structure 450 disposed on the fourth level 346. In one embodiment, the connection structure 450 can include an insulating layer 453 that includes $SiO_2$, SiON, $Si_3N_4$, and/or $Al_2O_3$ and/or other generally insulating materials applied to the fourth level 346 by sputtering, chemical vapor deposition, or another conventional technique. The thickness of the insulating layer 453 can be selected to control the capacitive coupling with the conductive structures of the underlying levels.

In one aspect of this embodiment, a very thin layer of an adhesive material, such as zirconium, titanium, and/or chromium can be applied to the upper surface of the fourth level 346 to improve adhesion between the insulating layer 453 and the metal components of the fourth level 346. In another aspect of this embodiment, the mechanical stress of the insulating layer 453 can be reduced by implanting a small dose of inert or other ions into the insulating layer 453. Alternatively, a metal strengthener can be deposited on the insulator (rather than reducing mechanical stress of the insulator itself). The metal can include a material such as titanium, which has a high elastic modulus, low density, and high resistivity. The stress in the metal layer can be reduced by implanting a small dose of inert or other ions into the metal layer, or (when the metal layer is sputtered), by controlling the sputtering parameters.

In any of the embodiments described above for forming the connecting structure 450, bond pads 451 are connected through the insulating layer 453 (and the metal strengthening layer, if present) to the conductive links 81. For example, vias 452 can extend between the bond pads 451 and the fourth level portions 341 of the conductive links 81. The bond pads 451 and vias 452 can be formed by conventional processes, such as photolithography in combination with reactive ion etching. When reactive ion etching is used and the fourth level portions 341 include copper, the copper can provide an etch stop. When the fourth level portions 341 include other materials, other processes (such as other etching processes) can be used to form the vias 452 and the bond pads 451.

In one embodiment, access openings 454 are formed in the insulating layer 453 and penetrate through the insulating layer 453 to the fourth level 346. The access openings 454 allow the sacrificial support structure 30 (FIG. 1A) to be removed from within the package 60. For example, when the sacrificial support structure 30 includes oxides and polymers, these materials can be removed with an oxidation or plasma process. In one aspect of this embodiment, the process can be completed at high pressure (such as ten atmospheres or greater). Any oxidation of the bond pads 451 can subsequently be removed using an inert ion plasma.

The resulting package 60 (shown in FIG. 5 with the sacrificial support structure removed) includes conductive links 81 having bridge portions 41b, 141b, 241b that are suspended between spaced apart endpoints and are surrounded by a low dielectric gas 455, such as air. FIG. 5 also shows the aperture 247 in the support structure 83 through which the second level bridge portion 241b passes. In an alternative embodiment, the air can be evacuated from the package 60 and replaced with other gases (such as argon or helium) that also have low dielectric constants but may have a higher heat conductivity for improved heat transfer from components within the package 60 to the external walls of the package 60.

One feature of an embodiment of the process described above with reference to FIGS. 1A–5 is that the permanent conductive structures 80 in each level can be formed from the same material. For example, the external wall portion 85, the conductive links 81, and the internal support structures 83 can include the same conductive material. One advantage of this feature is that the portions of these structures within each level can be formed simultaneously, for example by depositing all the conductive material in each level in a single step. Accordingly, an embodiment of the method can reduce the number of steps required to form the package 60, when compared with conventional methods that may include disposing different materials for the external wall, internal structures and/or conductive links.

Another advantage of this feature is that a greater portion of the package 60 is formed from materials having relatively high heat conductivity. Accordingly, it can be easier to transfer heat away from the package 60 and reduce the temperature at which the package operates, which is expected to increase the operating life and/or the performance characteristics of the package 60.

Once the package 60 is complete, it can be singulated from adjacent packages (not shown) and joined to a support substrate for coupling to other electronic components. For example, in one embodiment, the package can be attached to a printed circuit board 490 or other substrate by adhesively bonding the microelectronic substrate 20 to the printed circuit board and attaching wire bonds 492 between the bond pads 451 of the package 60 and corresponding contacts 491 on a printed circuit board 490. When the package 60 is configured to be positioned uprightly on the support substrate, the external walls 85 and the internal structures 83 are sized to support only the connection structure 450 and the forces resulting from connecting wire bonds to the connection structure 450.

Alternatively, the package 60 can be configured as a "flip chip" by attaching solder balls 493 to the bond pads 451 and inverting the package 60 so that the solder balls 493 contact corresponding ball pads on the printed circuit board 490 or other support substrate. When the package 60 is configured as a flip chip, the external walls 85 and internal support structures 83 are sized to support the microelectronic substrate 20.

In another aspect of this embodiment, the package 60 can be inverted, placed on the supporting substrate 490, and bonded to the substrate 490, all before removing the sacrificial support structure 30 from the package 60. An advantage of this method is that the sacrificial support structure 30 remains in place during more processing steps than it does with conventional techniques, reducing the likelihood for portions of the package 60 to collapse during these process steps.

In other embodiments, the process described above with reference to FIGS. 1A–5 can have other variations. For example, the processes can form packages 60 having more or fewer levels than are shown in FIGS. 1A–5. In one emodiment, the sacrificial support structure 30 can include a single layer of material rather than the upper level portion 30b and the lower level portion 30a described above with reference to FIG. 1A. In a further aspect of this embodiment, the single layer can include a single bulk material rather than a bulk material in combination with an etch stop material. The bulk material can include carbon or a polymer, such as a photoresist material. The cavities 35a–d (FIG. 1E) can be formed in the single material using a dual damascene process. For example, the cavities in the first level 46 that extend all the way through the sacrificial support structure 30 (such as he via cavities 35b, external wall cavities 35c and internal wall cavities 35d) are etched first, using a first mask and photoresist process, with the substrate upper surface 22 forming an etch stop layer. The cavities corresponding to structures that extend only part-way through the first level 46 (for example, the lateral cavities 35a) are formed by using a timed etch to stop short of the upper surface 22 of the substrate. The end result is a series of cavities 35 that look similar or identical to those shown in FIG. 1F. These cavities can be filled simultaneously with a metal, as described above with respect to FIG. 1F. A plasma process is then used to remove the polymer layers, leaving the conductive structures 80 (FIG. 5) in place.

When the sacrificial support structure 30 includes carbon, the cavities 35 can also be formed with a dual damascene process. The carbon can be exposed to a high temperature oxygen atmosphere to reduce the carbon to $CO_2$, again leaving the conductive structures 80 in place. In other embodiments, the sacrificial support structure 30 can include other materials, so long as these materials can be removed from the package 60, for example, using a wet etch, plasma etch, or oxidation process.

In still further embodiments, processes other than a dual damascene process can be used to form the cavities in the sacrificial support structure 30. For example, two single damascene processes can be used to first form those portions of the conductive structures 80 that contact the level below, and then form the portions of the conductive structures 80 that are suspended above the level below. An advantage of the dual damascene process is that the conductive material forming both portions of the conductive structures 80 are disposed in a single step, reducing the likelihood for physical and/or electrical disconnects between portions of the conductive structures within a single level.

In yet another embodiment, at least some of the structures 80 described above with reference to FIGS. 1A–5 can include insulating materials. For example, portions of the internal support structure 83 (or alternatively, the entire internal support structure 83) can include an insulating material. An advantage of forming all or part of the internal support structure 83 with insulating materials is that the structure can contact the conductive links 81 without causing short circuits between the links. Conversely, an advantage of forming the internal support structure 83 from the same conductive material as other conductive structures of the package 60 is that such structures can be formed simultaneously, as described above, and can enhance the rate at which heat is transferred from the package 60.

In yet another embodiment, the external wall 85 can be initially formed on the substrate 20 simultaneously with the conductive internal structures (such as the conductive links 81 and the internal support structure 83), and can subsequently be further processed. For example, the external wall 85 can be plated or otherwise treated to reduce the likelihood for corrosion of the external wall or other detrimental environmental effects.

In still another embodiment, an initially separate heat sink (not shown) can be attached to the package 60 after the package 60 has been formed. For example, when the package 60 has a flip chip configuration, the heat sink can be attached to the lower surface 23 (FIG. 1A) of the microelectronic substrate 20, which is exposed when the package 60 is flipped. Alternatively, when the package 60 remains upright, the heat sink can be attached to the connection structure 450, so long as the heat sink does not interfere with the wire bonds or other connecting elements attached to the bond pads 451. In either embodiment, the heat sink can improve the rate at which heat is transferred away from the package, increasing the performance and/or life expectancy of the package.

Figure 6:
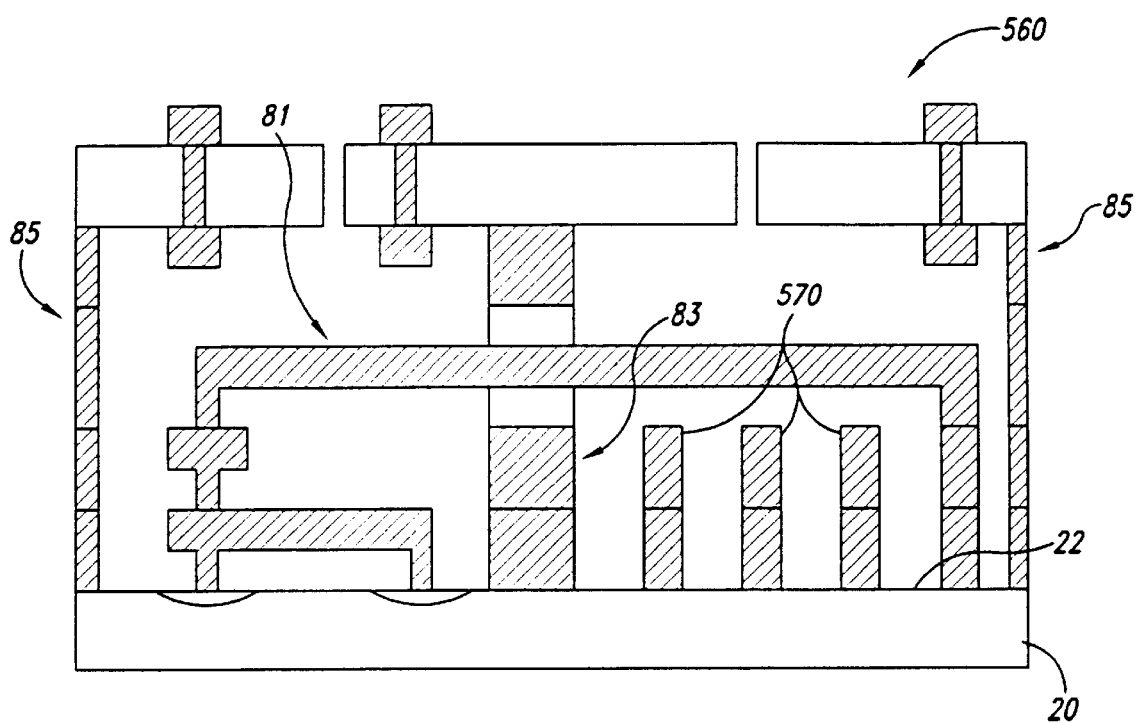
FIG. 6 is a partially schematic, cross-sectional side elevational view of a packaged microelectronic device having internal conductive heat transfer structures in accordance with another embodiment of the invention.

FIG. 6 is a partially schematic, side elevational view of a package 560 having internal heat transfer structures 570 that improve the rate of heat transfer from the package 560 in accordance with another embodiment of the invention. In one aspect of this embodiment, the heat transfer structures 570 extend upwardly from the upper surface 22 of the substrate 20. Alternatively, the heat transfer structures 570 can be connected to other portions of the package 560. In either embodiment, the heat transfer structures 570 do not provide structural support or electrical connections for the package 560, but instead are provided solely to transfer heat from within the package 560, for example, by transferring heat from the substrate 20 to the interior of the package where the heat can be absorbed by the external wall 85. The heat can be removed from the external wall 85 to the environment around the package 560 by convention, conduction and/or radiation. Accordingly, the heat transfer structures 570 can be coupled to the substrate 20, the external walls 85 and/or other structures within the package 560. The heat transfer structures 570 can include fins, ribs, posts or other structures with shapes suited for high heat transfer rates. In one aspect of this embodiment, the heat transfer structures 570 can be formed according to any of the processes described above with reference to FIGS. 1A–5, for example, by simultaneously depositing successively stacked portions of the heat transfer structures 570, along with the portions of the external walls 85, internal support structures 83, and conductive links 81. Alternatively, the heat transfer structures 570 can be formed by other processes.

From the foregoing, it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for manufacturing a microelectronic package, comprising:

forming microelectronic device features at least proximate to a surface of a microelectronic substrate;

simultaneously forming an external wall portion of the package and a conductive link coupled to at least one of the microelectronic device features; and removing a sacrificial material adjacent to the conductive link to suspend at least a portion of the conductive link between two points.

2. The method of claim 1, further comprising:

disposing the sacrificial material on the microelectronic substrate;

forming first and second voids in the sacrificial material with the first void corresponding to the external wall portion and the second void corresponding to the conductive link; and filling the first and second voids to simultaneously form the external wall portion of the package and the conductive link.

3. The method of claim 1 wherein the sacrificial material includes a first component and a second component, and wherein the method further comprises:

disposing a first layer of the first component on the microelectronic substrate;

disposing a first layer of the second component on the first layer of the first component to form a first etch stop layer;

disposing a second layer of the first component on the first etch stop layer;

disposing a second layer of the second component on the second layer of the first component to form a second etch stop layer;

forming a first void in first layer of the first component with the first void corresponding to the external wall portion and extending transverse to the surface of the microelectronic substrate;

forming a second void in the second layer of the first component with the second void corresponding to a region of the external wall portion extending transverse to the surface of the microelectronic substrate and a region of the conductive link extending along an axis generally aligned with the surface of the microelectronic substrate; and filling the first and second voids to simultaneously form the external wall portion of the package and the conductive link.

4. The method of claim 1, further comprising selecting the sacrificial material to include at least one of a carbonaceous material, a polymer, a polyimide, a photoresist material, parylene, and parylene-C.

5. The method of claim 1, further comprising selecting a material of the external wall portion and the conductive link to include at least one of copper and aluminum.

6. The method of claim 1, further comprising selecting a material for the external wall portion to be the same as a material for the conductive link.

7. The method of claim 1 wherein the external wall portion includes a first material, and wherein the method further comprises plating the external wall portion with a second material.

8. The method of claim 1 wherein the external wall portion is a first external wall portion and the conductive link is a first conductive link, and wherein the method further comprises:

simultaneously forming a second external wall portion of the package adjacent to the first external wall portion and a second conductive link adjacent to the first conductive link with the second external wall portion attached to the first external wall portion; and removing material adjacent to the second conductive link simultaneously with removing material adjacent to the first conductive link to suspend at least a portion of the second conductive link between two points.

9. The method of claim 1, further comprising:

forming an internal support member inward from the external wall portion of the package and simultaneously with forming the external wall portion of the package; and supporting the conductive link with the internal support member.

10. The method of claim 1, further comprising selecting a thickness of the external wall portion to support a weight of the package when the package is inverted with the microelectronic substrate facing upwardly.

11. The method of claim 1, further comprising:

forming an internal support member simultaneously with forming the external wall portion and the conductive link, the internal support member extending transverse to the surface of the microelectronic substrate;

forming an aperture through the internal support member; and disposing at least a portion of the conductive link in the aperture.

12. The method of claim 1, further comprising disposing a non-air gas adjacent to a portion of the conductive link suspended between the two points.

13. The method of claim 1, further comprising disposing a non-air gas including helium and/or argon adjacent to a portion of the conductive link suspended between the two points.

14. The method of claim 1 wherein forming the conductive link includes forming a first portion of the conductive link transverse to the surface of the microelectronic substrate and forming a second portion of the conductive link generally aligned with the surface of the microelectronic substrate.

15. A method for manufacturing a microelectronic package, comprising:

forming microelectronic device features at least proximate to a surface of a microelectronic substrate;

forming a conductive link coupled to at least one of the microelectronic device features;

temporarily supporting the conductive link with a sacrificial support material;

inverting the microelectronic substrate, the conductive link and the sacrificial support material to place the microelectronic substrate above the conductive link; and removing the sacrificial material adjacent to the conductive link while supporting the microelectronic substrate in an inverted position to suspend at least a portion of the conductive link between two points.

16. The method of claim 15, further comprising coupling solder balls to the conductive link.

17. The method of claim 15, further comprising:

coupling solder balls to the conductive link; and coupling the solder balls to a support member while the microelectronic substrate is in an inverted position and before removing the sacrificial material.

18. The method of claim 15, further comprising:

disposing the sacrificial material on the microelectronic substrate;

forming first and second voids in the sacrificial material with the first void corresponding to an external wall portion of the package and the second void corresponding to the conductive link; and filling the first and second voids to simultaneously form the external wall portion of the package and the conductive link.

19. A method for manufacturing a microelectronic package, comprising:

forming microelectronic device features at least proximate to a surface of a microelectronic substrate;

forming an external wall around at least a portion of the microelectronic substrate and the microelectronic device features; and forming a self-supporting internal heat transfer structure within the external wall, at least a portion of the heat transfer structure being spaced apart from the microelectronic substrate and the external wall, the internal heat transfer structure being electrically isolated from the device features and positioned to support only itself.

20. The method of claim 19, further comprising:

forming a conductive link coupled to at least one of the microelectronic device features; and removing a sacrificial material adjacent to the conductive link to suspend at least a portion of the conductive link between two points.

21. The method of claim 19, further comprising:

simultaneously forming the heat transfer structure, a portion of the external wall, and a conductive link coupled to at least one of the microelectronic device features; and removing a sacrificial material adjacent to the conductive link to suspend at least a portion of the conductive link between two points.

22. The method of claim 19, further comprising:

disposing a sacrificial material on the microelectronic substrate;

forming first, second and third voids in the sacrificial material with the first void defining a portion of the external wall, the second void defining a conductive link and the third void defining the heat transfer structure;

filling the first, second and third voids to simultaneously form the external wall portion, the conductive link and the heat transfer structure; and removing the sacrificial material adjacent to the conductive link to suspend at least a portion of the conductive link between two points.

23. A method for manufacturing a microelectronic package, comprising:

forming microelectronic device features at least proximate to a surface of a microelectronic substrate;

coupling at least one of the microelectronic device features to a conductive link; and forming an external wall around at least a portion of the microelectronic substrate and the microelectronic device features with a composition of the external wall being substantially identical to a composition of the conductive link.

24. The method of claim 23, further comprising simultaneously forming a portion of the external wall portion of the package and the conductive link.

25. The method of claim 23, further comprising removing a sacrificial material adjacent to the conductive link to suspend at least a portion of the conductive link between two points.

26. The method of claim 23, further comprising forming a self-supporting internal heat transfer structure within the external wall, at least a portion of the heat transfer structure being spaced apart from the microelectronic substrate and the external wall, the heat transfer structure being electrically isolated from the device features and supporting no components other than itself.

27. A method for manufacturing a microelectronic device package, comprising:

forming microelectronic device features at least proximate to a surface of a microelectronic substrate;

performing a single set of process steps to form both a portion of an external wall of the package and a conductive link coupled to at least one of the microelectronic device features, with the external wall portion and the conductive link having at least approximately identical compositions; and removing a sacrificial material between the conductive link and the surface of the microelectronic substrate to suspend a portion of the conductive link relative to the surface of the microelectronic substrate.

28. The method of claim 27 wherein performing a single set of process steps includes:

disposing a first component of the sacrificial material on the microelectronic substrate to form a first layer of the first component having a thickness corresponding to a thickness of a gap between the suspended portion of the conductive link and the surface of the microelectronic substrate;

disposing a second component of the sacrificial material on the first layer of the first component to form a first etch stop layer;

disposing a second layer of the first component on the first etch stop layer to a thickness corresponding to a thickness of the suspended portion of the conductive link;

disposing the second component of the sacrificial material on the second layer of the first component to form a second etch stop layer;

forming a void in the second layer of the first component, with the void defining the shape of a region of the external wall portion extending transverse to the surface of the microelectronic substrate and the suspended portion of the conductive link generally aligned with the surface of the microelectronic substrate;

forming another void in first layer of the first component with the other void defining the shape of another region of the external wall portion extending transverse to the surface of the microelectronic substrate; and filling the voids to simultaneously form the external wall portion of the package and the conductive link.

29. The method of claim 27 wherein performing a single set of process steps includes:

disposing the sacrificial material on the microelectronic substrate;

etching a first void in the sacrificial material with the first void defining the shape of the external wall portion that extends transverse to the surface of the microelectronic substrate;

etching a second void in the sacrificial material after etching the first void, with the second void defining the shape of the suspended portion of the conductive link generally aligned with the surface of the microelectronic substrate; and filling the first and second voids to simultaneously form the external wall portion of the package and the conductive link.

30. The method of claim 27 wherein the external wall portion is a first external wall portion and the conductive link is a first conductive link, and wherein the method further comprises repeating the set of process steps to form a second external wall portion attached to the first external wall portion and form a second conductive link in a plane offset and generally parallel to a plane of the first conductive link.

31. The method of claim 27, further comprising:

disposing the sacrificial material on the microelectronic substrate;

forming first and second voids in the sacrificial material with the first void defining a shape of the external wall portion and the second void defining a shape of the conductive link; and filling the first and second voids to simultaneously form the external wall portion of the package and the conductive link.

32. The method of claim 27, further comprising selecting a material for the external wall portion to be the same as a material for the conductive link.

33. The method of claim 27, further comprising:

forming an internal support member inward from the external wall of the package and simultaneously with forming the external wall portion of the package; and supporting the conductive link with the internal support member.

34. The method of claim 27, further comprising:

selecting a thickness of the external wall portion to support a weight of the package when the package is inverted with the substrate facing upwardly;

inverting the package;

electrically coupling the package to another device; and removing the sacrificial support material after inverting and electrically coupling the package.

35. A method for manufacturing a microelectronic device package, comprising:
- forming microelectronic device features in a microelectronic substrate;
- depositing a sacrificial mandrel material on a surface of the microelectronic substrate;
- selectively removing portions of the mandrel material to form first voids defining locations of external wall portions of the package and simultaneously form second voids defining locations of conductive links extending in a first direction aligned with the surface of the microelectronic substrate and a second direction transverse to the surface of the microelectronic substrate;
- disposing a conductive material in the first and second voids to form the external wall portions and the conductive links; and
- removing the mandrel material adjacent to the conductive links to suspend at least a portion of the conductive links.

36. The method of claim 35 wherein the mandrel material includes a first constituent and a second constituent, and wherein the method further comprises:
- selecting the second constituent to include at least one of silicon dioxide and silicon nitride; and
- disposing a layer of the second constituent adjacent the first constituent to form an etch stop layer.

37. The method of claim 35 wherein the mandrel material is a first mandrel material and the conductive material is a first portion of conductive material, further comprising:
- disposing a second mandrel material on the first portion of conductive material;
- forming third voids in the second mandrel material with the third voids coupled to the external wall portions;
- forming fourth voids in the second mandrel material with the fourth voids coupled to the conductive links; and
- disposing a second portion of conductive material in the third and fourth voids to extend the external wall portions and the conductive links.

38. The method of claim 35, further comprising planarizing the device package by engaging the device package with a planarizing medium and moving at least one of the package and the planarizing medium relative to the other to simultaneously remove a portion of the conductive material and the mandrel material.

* * * * *

UNITED STATES PATENT AND TRADEMARK OFFICE
CERTIFICATE OF CORRECTION

PATENT NO. : 6,709,968 B1
DATED : March 23, 2004
INVENTOR(S) : Jerome M. Eldridge et al.

It is certified that error appears in the above-identified patent and that said Letters Patent is hereby corrected as shown below:

Title page, Item [54] and Column 1, line 1,
Title, delete "WITH" between "DEVICE" and "PACKAGE";

Title page,
Item [56], References Cited, OTHER PUBLICATIONS, insert the following:
-- Singer, Peter, "The New Low-K Candidate: It's a Gas," *Semiconductor International*, p. 38, March 1998. --;
-- Blodgett and Barbour, "Thermal Conduction Module: A High-Performance Multilayer Ceramic Package," *IBM J. Res. Develop.* 26(1): 30-36, January 1982. --;

Column 2,
Line 9, delete comma between "bridges" and "also";

Column 4,
Line 23, delete comma between "sacrificial" and "support";

Column 8,
Line 52, "he" should be -- the --;

Signed and Sealed this

Third Day of August, 2004

JON W. DUDAS
*Acting Director of the United States Patent and Trademark Office*